(12) United States Patent
Ferrotti et al.

(10) Patent No.: US 9,899,800 B2
(45) Date of Patent: Feb. 20, 2018

(54) LASER DEVICE AND PROCESS FOR FABRICATING SUCH A LASER DEVICE

(71) Applicants: Commissariat a l'energie atomique et aux energies alternatives, Paris (FR); ST Microelectronics SA, Montrouge (FR); ST Microelectronics (Crolles 2) SAS, Crolles (FR)

(72) Inventors: Thomas Ferrotti, Entre-Deux-Eaux (FR); Badhise Ben Bakir, Brezins (FR); Alain Chantre, Seyssins (FR); Sebastien Cremer, Grenoble (FR); Helene Duprez, Seyssinet-Pariset (FR)

(73) Assignees: Commissariat A L'Energie Atomique et aux Energies Alternatives, Paris (FR); ST Microelectronics SA, Montrouge (FR); ST Microelectronics (Crolles 2) SAS, Crolles (FR)

(*) Notice: Subject to any disclaimer, the term of this patent is extended or adjusted under 35 U.S.C. 154(b) by 0 days.

(21) Appl. No.: 15/349,515

(22) Filed: Nov. 11, 2016

(65) Prior Publication Data

US 2017/0141541 A1    May 18, 2017

(30) Foreign Application Priority Data

Nov. 13, 2015    (FR) ..................... 15 60911

(51) Int. Cl.
*H01S 5/20*        (2006.01)
*H01S 5/323*       (2006.01)
(Continued)

(52) U.S. Cl.
CPC ............ *H01S 5/2031* (2013.01); *H01S 5/021* (2013.01); *H01S 5/1014* (2013.01); *H01S 5/125* (2013.01);
(Continued)

(58) Field of Classification Search
CPC ...... H01S 5/2031; H01S 5/2027; H01S 5/323; H01S 5/06256; H01S 5/125; H01S 3/0675
See application file for complete search history.

(56) References Cited

U.S. PATENT DOCUMENTS

2004/0165637 A1    8/2004  Bullington et al.
2004/0218638 A1*  11/2004  Carter ................. H01S 5/06256
                                                          372/20
(Continued)

FOREIGN PATENT DOCUMENTS

DE    39 34 865 A1    4/1991
DE    44 20 389 A1   12/1995
(Continued)

OTHER PUBLICATIONS

French Search Report (with Written Opinion) dated Jul. 28, 2016 in French Application 15 60911 filed on Nov. 13, 2015 (with English Translation of Categories of Cited Documents).

*Primary Examiner* — Xinning Niu
(74) *Attorney, Agent, or Firm* — Oblon, McClelland, Maier & Neustadt, L.L.P.

(57) ABSTRACT

A III-V heterostructure laser device located in and/or on silicon, including a III-V heterostructure gain medium, a rib optical waveguide, located facing the gain medium and including a strip waveguide equipped with a longitudinal rib, the rib optical waveguide being located in the silicon, two sets (RBE-A, RBE-B) of Bragg gratings formed in the rib optical waveguide and located on either side of the III-V heterostructure gain medium, each set (RBE-A, RBE-B) of Bragg gratings including a first Bragg grating (RB1-A, RB1B) having a first pitch and formed in the rib and a second Bragg grating (RB2-A, RB2-B) having a second
(Continued)

pitch different from the first pitch and formed on that side of the rib waveguide which is opposite the rib.

17 Claims, 14 Drawing Sheets

(51) Int. Cl.
  *H01S 5/02* (2006.01)
  *H01S 5/10* (2006.01)
  *H01S 5/12* (2006.01)
  *H01S 5/125* (2006.01)
  *H01S 5/065* (2006.01)

(52) U.S. Cl.
  CPC .......... *H01S 5/1206* (2013.01); *H01S 5/1231* (2013.01); *H01S 5/2027* (2013.01); *H01S 5/323* (2013.01); *H01S 5/0654* (2013.01)

(56) References Cited

U.S. PATENT DOCUMENTS

2011/0299561 A1* 12/2011 Akiyama ............ H01S 5/02248
  372/50.11
2013/0259077 A1* 10/2013 Ben Bakir ......... G02B 6/12004
  372/44.01

FOREIGN PATENT DOCUMENTS

JP  63-20892   1/1988
JP  4-349683   12/1992

* cited by examiner

LASER DEVICE AND PROCESS FOR FABRICATING SUCH A LASER DEVICE

TECHNICAL FIELD

The present invention relates to the field of integrated photonic components that use both the properties of semiconductors able to emit light and the properties of semiconductors conventionally used in integrated circuits.

More particularly, the present invention relates to a laser device and to a process for fabricating such a laser device.

Such a laser device may be employed to produce high-speed optical links, intrachip links, intraboard links and/or links over free space.

PRIOR ART

An important aspect in silicon photonics is the wavelength tuneability of semiconductor lasers, especially when they are applied in telecommunications in networks employing wavelength multiplexing.

Various solutions have been proposed, among which mention may be made of the use of distributed Bragg reflector (DBR) lasers.

Specifically, if a heating element is placed near the Bragg gratings, the temperature of the Bragg gratings may be increased with precision by applying a current to the heating elements. As the refractive index of the silicon is modified by the variation in temperature, this allows the wavelength output from such a laser to be modified in a certain wavelength range.

However, the range of tunability is often limited to less than 20 nm, which is too small. In addition, it is possible to modify the output wavelength only toward longer wavelengths (toward the red), and not in the other direction. In addition, the heat dissipated by the heating elements is also a problem in terms of ageing of the laser and consumption of electrical power.

To overcome these problems, it has been proposed to equip DBR lasers with sampled Bragg gratings or sampled-grating distributed Bragg reflectors (SG-DBRs).

In a sampled Bragg grating, on a first Bragg grating is superposed a second grating having a larger pitch than the first grating.

In this case, the pitch of the first Bragg grating defines the central output wavelength, whereas the pitch of the second Bragg grating adds additional reflection peaks.

When a reflection peak of the first grating is in coincidence with a reflection peak of the second grating the lowest threshold is obtained, this therefore defining the oscillation frequency of the laser.

In an SG-DBR laser, if the refractive index or pitch of a sampled Bragg grating is changed, for example by heating with a current, it is possible, via the Vernier effect, to make the coincidence jump to one of the following reflection peaks, thereby allowing tunability in jumps over a wide wavelength range and in both directions, i.e. toward lower frequencies or toward higher frequencies. By changing the refractive indices of the two sampled Bragg gratings simultaneously, for example via a thermodynamic effect, fine and continuous tunability may be obtained. The tunability of this type of laser covers a range of more than 100 nm, this meaning that this type of laser is particularly advantageous in the field of telecommunications, especially in wavelength division multiplexing (WDM) technologies.

However, in the SG-DBR lasers known from the prior art, the first grating and the second grating of a sampled Bragg reflector are produced in superposition on the same side of a semiconductor layer, this creating production constraints and limiting design flexibility. In addition, this generally requires the sampled Bragg reflectors to be long and bulky in order to obtain a high efficiency, in particular for the second grating with the longer pitch than the first grating.

The present invention aims to at least partially mitigate the aforementioned drawbacks by providing a laser device allowing greater design freedom and a smaller bulk to be obtained while nonetheless having a high reflectivity per unit length.

For this purpose, the present invention provides a III-V heterostructure laser device located in and/or on silicon, comprising:
- a III-V heterostructure gain medium,
- a rib optical waveguide, located facing the gain medium and comprising a strip waveguide equipped with a longitudinal rib, the rib optical waveguide being located in the silicon,
- two sets of Bragg gratings formed in the rib optical waveguide and located on either side of the III-V heterostructure gain medium,
- each set of Bragg gratings comprising a first Bragg grating having a first pitch and formed in the rib and a second Bragg grating having a second pitch different from the first pitch and formed on that side of the rib waveguide which is opposite the rib.

In particular, by physically decorrelating the two gratings of a set of Bragg gratings, it is possible to decouple the wavelength selectivity obtained via the Vernier effect. In addition, as regards the reflectivity of the two Bragg gratings, an enhanced reflectivity is obtained and therefore a more effective Bragg reflector. This makes it possible to produce DBR lasers that are shorter and less bulky than known SG-DBR lasers but that nonetheless still operate in a similar way.

The laser device may, according to the invention, include one or more of the following aspects alone or in combination:

According to one aspect, the rib optical waveguide is oriented so that the rib is located on that side of the strip waveguide that is distal with respect to the gain medium.

According to another aspect, the first pitch of the first Bragg gratings formed, and especially etched, in the rib is larger than the second pitch of the second grating formed, and especially etched, on that side of the rib waveguide which is opposite the rib.

One of the sets of Bragg gratings for example possesses a length comprised between 700 µm and 1000 µm, limits inclusive, and a reflectivity higher than 90%, and the other of the sets of Bragg gratings possesses a length comprised between 300 µm and 600 µm, limits inclusive, and a reflectivity comprised between 30% and 80%, limits inclusive.

According to another aspect, the first Bragg gratings are formed by narrow sections and wider sections of the rib.

The width of the rib in the narrow sections may be comprised between 0%-80% of the width of the wider sections of the rib.

According to another aspect, the second Bragg gratings are only formed, and especially etched, at the level of the first Bragg gratings in the location of the wider sections of the rib.

According to an alternative, the second Bragg gratings are only formed, and especially etched, at the level of with the first Bragg gratings in the location of the narrow sections of the rib.

Moreover, the transition between the narrow sections and the wide sections defines transitional flanks that are for example oriented perpendicularly to the propagation direction of the light.

As a variant, the transition between the narrow sections and the wide sections defines transitional flanks that are inclined with respect to a direction that is perpendicular to the propagation direction of the light.

The etching depth of the two gratings of a set of Bragg gratings may be different.

In particular, the etching depth of the first gratings is larger than the etching depth of the second gratings.

The width of the second gratings of the sets of Bragg gratings is for example larger than that of the rib.

Provision may be made for the width of the second gratings of the sets of Bragg gratings to be substantially equal to the width of the strip waveguide.

According to another aspect, the strip waveguide and the longitudinal rib are each formed from crystalline silicon or one is made of crystalline silicon and the other of amorphous silicon.

The longitudinal rib is for example made of crystalline silicon and the strip waveguide is for example formed by two layers, the layer making contact with the longitudinal rib also being made of crystalline silicon and the other layer proximal to the gain medium being made of amorphous silicon.

The invention also relates to a process for fabricating a laser device, which is especially such as defined above, comprising the following steps:
producing a rib waveguide comprising a strip waveguide equipped with a longitudinal rib in a silicon layer that is located above a buried insulating layer, which itself is located above a carrier substrate;
producing by etching in the rib first gratings of the sets of Bragg gratings;
encapsulating in a first insulating layer the rib waveguide;
flipping the assembly;
removing the carrier substrate and the first buried insulating layer so as to uncover a side of the strip waveguide;
producing by etching the second gratings of the sets of Bragg gratings in the side of the strip waveguide;
depositing a second insulating layer and carrying out chemical-mechanical polishing of the second insulating layer;
depositing a heterostructure formed from III-V semiconductor; and
carrying out selective chemical etching of the heterostructure to obtain a gain medium.

BRIEF DESCRIPTION OF THE DRAWINGS

Other advantages and features will become apparent on reading the description of the invention, and from the following figures, in which.

DESCRIPTION OF EMBODIMENTS

In all the figures, identical elements have been given the same reference numbers.

The following embodiments are examples. Although the description refers to one or more embodiments, this does not necessarily mean that each reference concerns the same one embodiment, or that the features apply only to one single embodiment. Individual features of the various embodiments may also be combined to produce other embodiments.

In the description, certain components or parameters may be indexed, for example first element or second element or first parameter and second parameter or even first criterion and second criterion, etc. In this case, it is merely a question of a simple indexation allowing similar but nonidentical elements or parameters or criteria to be differentiated and designated. This indexation does not imply a priority of one element, parameter or criterion with respect to another and such designations may easily be interchanged without departing from the scope of the present description.

In the present description, the term "longitudinal" must be understood to mean substantially parallel to the direction of propagation (see arrow F1) of the light and the term "transverse" must be understood to mean substantially transverse to the direction of propagation of light.

By "pitch of a Bragg grating", what is meant is the length of one period of the Bragg grating. By "peak of a Bragg grating" or "reflection peak" what is meant is a generally small spectral range in which the reflectivity of the Bragg grating is sufficiently high to allow it to be used as an optical-cavity end reflector, in particular in the context of a laser.

When a wavelength range is indicated to be "limits inclusive" this means that the limiting values defining the wavelength range also form part of this range. Thus, for a wavelength range between 500 nm and 600 nm, limits inclusive, the values 500 nm and 600 nm also form part of the wavelength range.

By convention, in an optical circuit produced in a given plane, transverse electric (TE) and transverse magnetic (TM) polarization states are defined such that, in the TE state, the electric field is parallel to the plane of the circuit whereas the magnetic field is perpendicular to the plane of the circuit and, in the TM state, the magnetic field is parallel to the plane of the circuit whereas the electric field is perpendicular to the plane of the circuit. In fact, in the laser it is implicitly necessary to consider a quasi-TE polarization, i.e. the electric field is almost entirely polarized in its TE direction. Thus, the laser structure such as described will preferably allow coupling to the quasi-TE or TE mode of the wave.

FIGS. 1 to 4 show a first embodiment of a laser device 1 according to the invention. In this embodiment it is a question of an integrated on-silicon distributed Bragg reflector (DBR) doped III-V heterostructure laser device.

Figure 1:
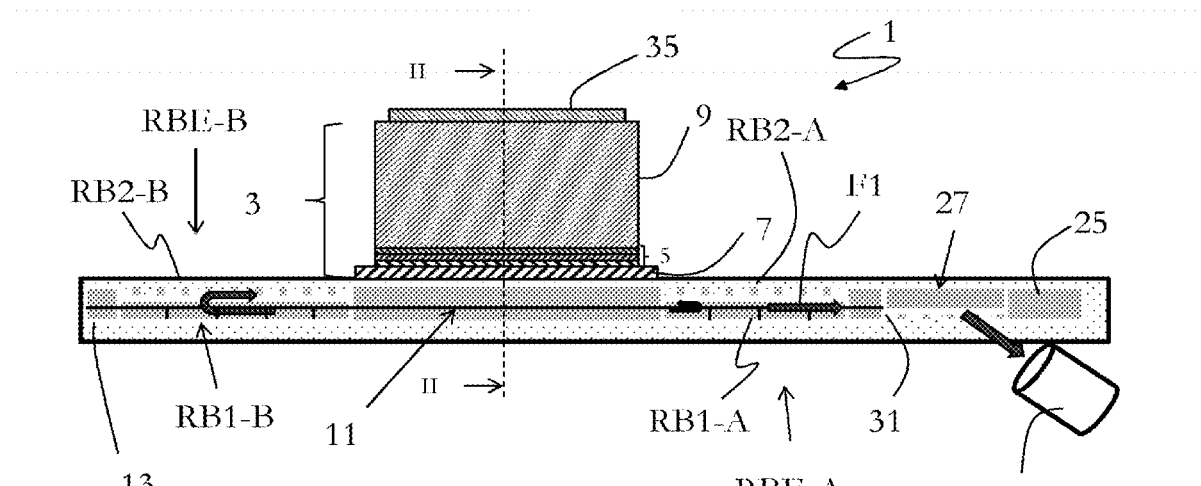
FIG. 1 shows a schematic longitudinal cross-sectional view of a first embodiment of a laser device according to the invention.
Figure 2:
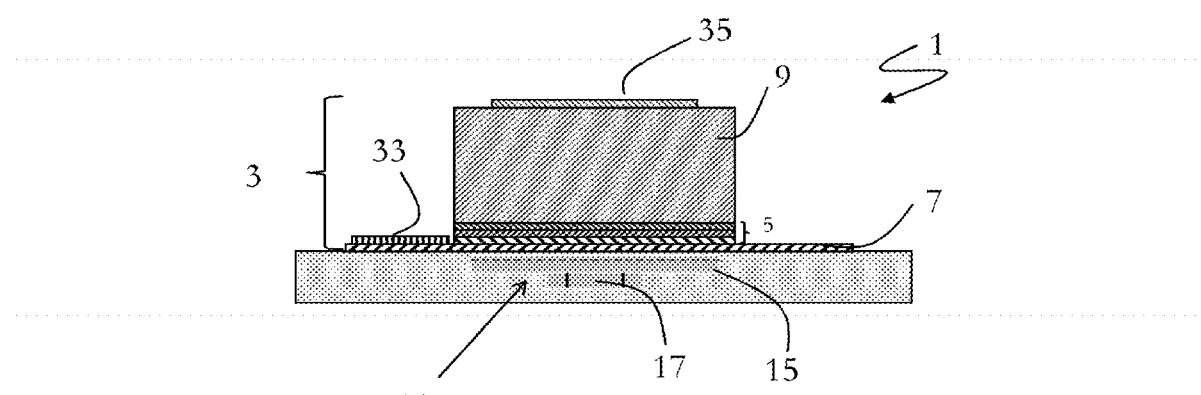
FIG. 2 shows a schematic transverse cross-sectional view of the laser device in FIG. 1 and cut along the cutting line II-II in FIG. 1.
Figure 3A:
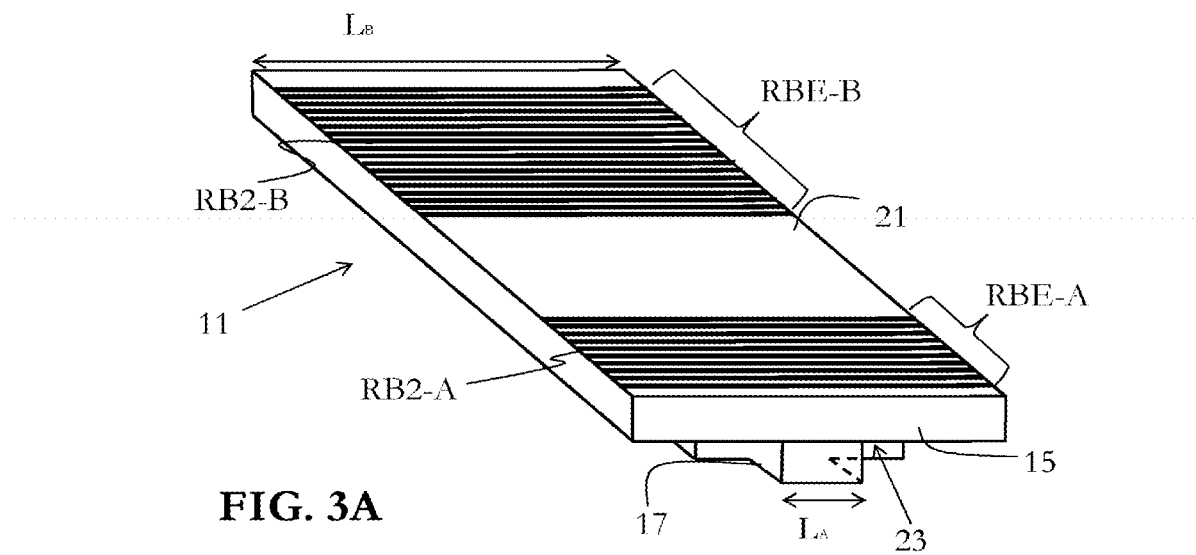
FIG. 3A shows in perspective a schematic representation of the rib waveguide of the laser device in FIG. 1.
Figure 3B:
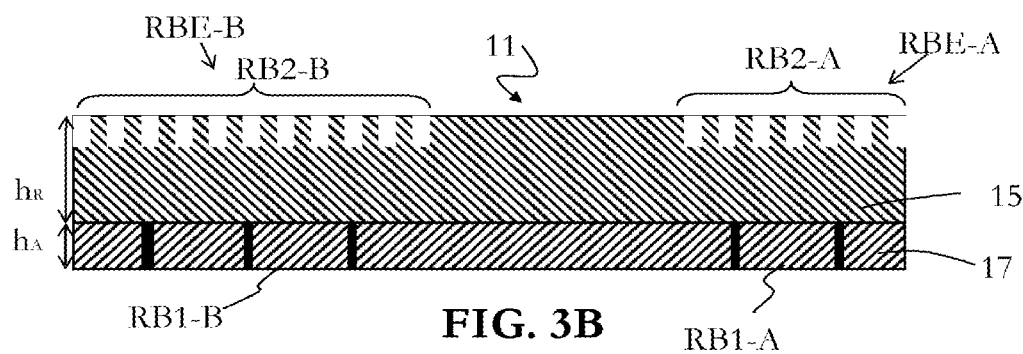
FIG. 3B shows a schematic representation in longitudinal cross section of the rib waveguide of the laser device in FIG. 1.
Figure 3C:
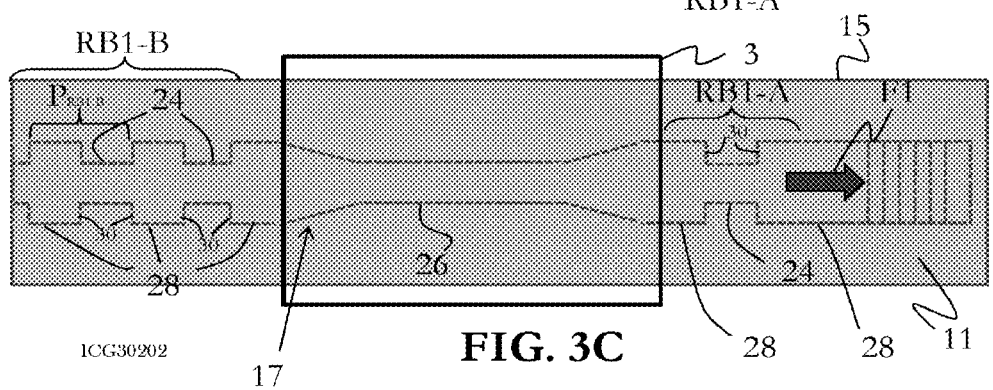
FIG. 3C shows a schematic representation seen from above of the rib waveguide of the laser device in FIG. 1.
Figure 4:
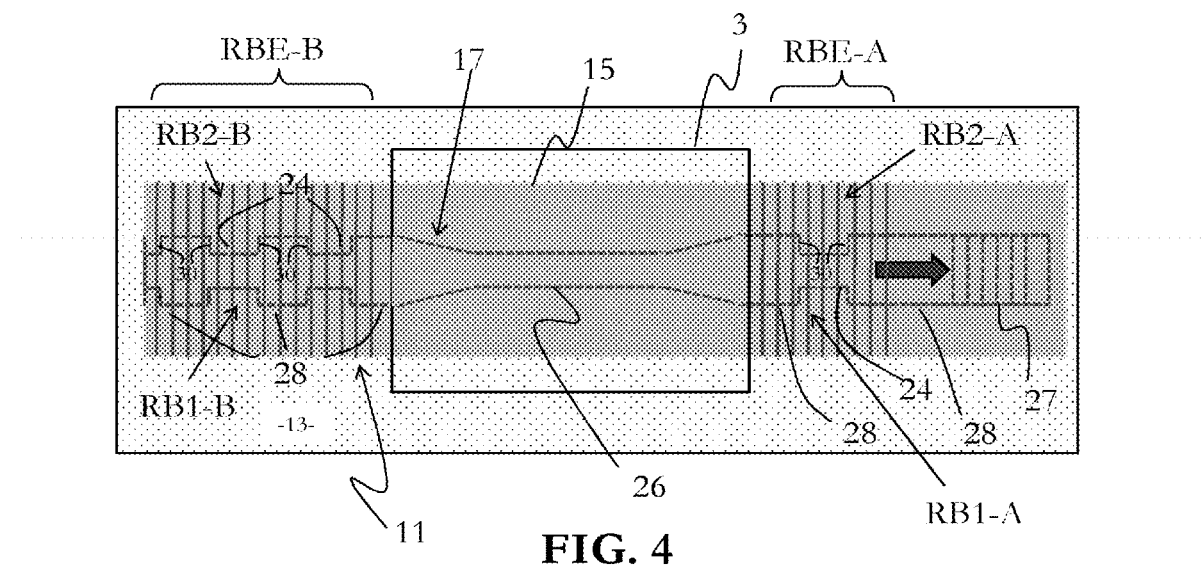
FIG. 4 shows a partial top view of the laser device in FIG. 1.

FIG. 1 is a schematic longitudinal cross-sectional view and FIG. 2 is a transverse cross-sectional view cut along the cutting line II-II in FIG. 1. FIG. 3A shows a schematic representation in perspective of the rib waveguide of the laser device in FIG. 1. FIG. 3B shows a schematic representation in longitudinal cross section of the rib waveguide of the laser device 1 in FIG. 1. FIG. 3C shows a schematic representation seen from above of the rib waveguide of the laser device 1 in FIG. 1, and FIG. 4 shows a partial top view of the laser device 1.

The laser device 1 includes a III-V heterostructure optical gain medium 3, the heterostructure being arranged to generate photons, or in other words an optical wave.

By III-V heterostructure, what is meant is the use of materials possibly chosen from the following nonexhaustive list: InP, GaAs, InGaAlAs, InGaAsP, AlGaAs and InAsP. The heterostructure of such a gain medium 3 (also called an amplifying medium) may include a stack of various layers, such as for example a stack 5 of layers forming quantum wells sandwiched between a first doped layer 7, which is preferably n-doped, and a second doped layer 9, which is preferably p-doped.

Typically the layer 9 will be p-doped to the order of $10^{19}$ cm$^3$ and the layer 7 n-doped to the order of $10^{18}$ cm$^3$. More precisely, the layers 7 and 9 may themselves be formed epitaxially and be composed of a plurality of differently doped sublayers (doping density increasing with distance from the quantum wells). The quantum wells are not doped.

The first doped layer 7, when it is n-doped, may include a material chosen, for the most part, from InP, GaAs, InGaAsP, InGaAlAs, AlGaAs and InAsP. The second doped layer 9, when it is p-doped, may include a material chosen from InP, GaAs, InGaAsP and InGaAlAs. In other words, the materials used for the first layer 7 and the second layer 9 may be the same, only the dopant type and density changing.

Of course, the dopant type may be inverted, i.e. the first doped layer 7 may be p-doped, and the second doped layer 9 may be n-doped. The stack 5 of layers may include quantum wells or quantum dots allowing holes and electrons to recombine to form photons, and thus generate the optical wave in the gain medium 3. The quantum elements (wells or dots) may include a material such as InP, GaAs, InGaAsP, InGaAlAs, AlGa, As and InAsP.

The thickness of the heterostructure gain medium 3 is typically about a plurality of microns.

The thickness of the stack of quantum wells 5 is about 200-400 nm and for example 300 nm, and the thickness of the layer 7 is about 100-200 nm. The layer 9 may have a thickness comprised between 1-3 μm.

As is shown in FIGS. 1 and 2, under the gain medium 3 is located a rib optical waveguide 11 that is integrated or formed in a silicon-on-insulator (SOI) layer 13.

This rib waveguide 11 is placed facing the gain medium 3 and is made up of a strip waveguide 15 equipped with a longitudinal rib 17 (see FIGS. 2 and 3A). The strip waveguide 15 and the longitudinal rib 17 are for example both formed from crystalline silicon.

However, other options are possible. A first case will in particular be noted in which the strip waveguide 15 is made of crystalline silicon and the longitudinal rib 17 is made of amorphous silicon.

According to a second particularly advantageous case, the longitudinal rib 17 is made of crystalline silicon and the strip waveguide 15 is formed by two layers, the layer making contact with the longitudinal rib 17 also being made of crystalline silicon and the other layer proximal to the gain medium 3, i.e. the layer that is closest the gain medium 3, being made of amorphous silicon. The longitudinal rib 17 and the crystalline-silicon layer of the strip waveguide 15 are in the silicon-on-insulator (SOI) layer 13, whereas the amorphous-silicon layer is located in an insulating layer above the silicon-on-insulator layer. This arrangement makes it possible to retain a maximal compatibility with existing front-side silicon photonic devices and processes and to minimize the thermal budget applied to the amorphous-silicon layer.

Seen in cross section (FIG. 2), the strip waveguide 15 and the longitudinal rib 17 are both rectangular, but their width, and especially the width of the rib 17, may vary in the propagation direction of the light (example in FIGS. 3C and 4).

More specifically, the rib optical waveguide 11 is oriented so that the rib 17 is located on that side 23 of the strip waveguide 15 which is distal with respect to the gain medium 3.

The laser device 1 comprises two sets RBE-A and RBE-B of Bragg gratings that are located on either side of the III-V heterostructure gain medium 3.

Each set RBE-A, RBE-B of Bragg gratings comprises a first Bragg grating RB1-A and RB1-B, respectively, having a first pitch and for example produced by etching the rib 17 of the rib optical waveguide 11, and a second Bragg grating RB2-A and RB2-B, respectively, taking the form of a Bragg grating having a second pitch that is different from the first pitch, and produced by etching that side 21 of the strip waveguide 15 which is opposite the rib 17. In particular, the pitch of the first Bragg grating RB1-A and RB1-B etched into the rib 17 is larger than the pitch of the second grating RB2-A and RB2-B etched on that side 21 of the strip waveguide 15 which is opposite the rib. The effective index in the case of a silicon grating and for telecom wavelengths is comprised between 3.3 and 3.7. The pitches of the gratings RB2-A and RB2-B are both equal to a value comprised between 150 and 300 nm (comprised between $\lambda/7$ or $\lambda/6$). The pitch of the gratings RB1-A and RB1-B are not equal. They are such that a difference in their first peaks is about one nm (abs($\Delta\lambda1-\Delta\lambda2$))≈1 nm, $\Delta\lambda1$ being the difference in the first peaks of RB1-A and $\Delta\lambda2$ being the difference in the peaks of RB1-B. These differences $\Delta\lambda1$ and $\Delta\lambda2$ between first peaks are typically comprised between 5 nm and 20 nm. A pitch range for the gratings RB1-A, RB1-B of between 10 μm and 40 μm results. The group index $n_g$ is about 4 for silicon in the telecom wavelength range.

As may in particular be seen in FIG. 3C, in the transverse direction the rib 17 possesses at its two ends narrow sections 24 and wider or enlarged sections 28, thus forming the first Bragg gratings RB1-A and RB1-B.

The width of the narrow sections 24 is comprised between 0%-80% of the width of the wider sections 28 of the rib 17.

In this first embodiment, the transition between the narrow sections 24 and the wider or enlarged portions 28 defines transitional flanks 30 that are oriented perpendicularly to the propagation direction F1 of the light.

The set RBE-B of Bragg gratings possesses a length comprised between 700 µm and 1000 µm, limits inclusive, and a reflectivity higher than 90%, and the other set RBE-A of Bragg gratings possesses a length comprised between 300 µm and 600 µm, limits inclusive, and a reflectivity comprised between 30% and 80%, limits inclusive. The lengths of the gratings RB1-A and RB1-B/RB2-A and RB2-B are preferably equal, but they may in certain cases be slightly different especially if the length is not also a multiple of the pitches of the gratings RB1-A and RB1-B/RB2-A and RB2-B.

To obtain better coupling, the central section 26 of the rib 17, which section is located under the gain medium 3, also possesses a smaller width, especially with respect to the sections 28, and for example has the same width as that of the narrow sections 24. The width of the section 26 will typically be smaller than 800 nm.

The longitudinal rib 17 located under the strip waveguide 15 (as shown in FIGS. 1 to 4) is distal with respect to the gain medium 3. By "distal", what is meant is that the rib 17 is located on the side 23 opposite the side 21: the side 23 is the furthest from the gain medium.

This is also clearly visible in FIG. 3A, which shows the rib waveguide 11 on its own.

As may be seen in FIG. 3A, the width $L_B$ of the second Bragg gratings RB2-A and RB2-B is larger than the width $L_A$ of the rib 17. In particular, the width $L_B$ of the second Bragg gratings RB2-A and RB2-B is equal to the width of the strip waveguide 15.

In addition, the width $L_B$ of the second Bragg gratings RB2-A and RB2-B may be chosen independently of the width $L_A$ of the rib and of the first Bragg gratings RB1-A and RB1-B, without influencing the reflectivity of the second Bragg gratings RB2-A or RB2-B. The width $L_B$ of the second Bragg gratings RB2-A or RB2-B is chosen to be larger than one µm.

FIG. 3B shows a schematic longitudinal cross-sectional view (in the propagation direction of the light) of the rib waveguide 11 with the sets RBE-A and RBE-B of Bragg gratings.

The height $h_A$ of the rib 17 is comprised between 100 nm and 250 nm and in particular is 200 nm.

The height $h_R$ of the strip guide 15 is comprised between 250 nm and 350 nm and in particular is 300 nm.

Reference is now made to FIG. 4, which shows a partial top view of the laser device in FIG. 1.

In FIG. 4, the second Bragg gratings RB2-A and RB2-B are represented by transverse solid lines and the shape of the rib 17 is shown by dotted lines.

The central section 26 of the rib 17 is located under the footprint of the gain medium 3, which is shown by a square.

On the left of FIG. 4, the second Bragg grating RB2-B, which is etched into the side 21 of the strip waveguide 15, may be seen.

The rib 17 is wide or enlarged in the section in which the second Bragg grating RB2-B is located and possesses regularly spaced narrow portions 24, thus forming, via the structuring of the rib 17, the first Bragg grating RB1-B.

The first Bragg grating RB1-A or RB1-B is formed by the periodicity of the flanks 30 between the narrow portions 24 and the wide or enlarged portions 28. For example, a period $P_{RB1-B}$ is defined, in either one of the propagation directions, by the distance between two flanks 30 of given transition, for example wide to narrow or vice versa.

In FIG. 4, three narrow sections 24 have been used to form the first Bragg grating RB1-B, but there may well be more narrow portions arranged with a different periodicity.

Because the pitch of the first grating RB1-B is larger than that of the second Bragg grating RB2-B, additional reflection peaks are obtained for this set RBE-B of Bragg gratings.

On the right of FIG. 4, a similar structure with a shorter set of RBE-A Bragg gratings for the output may be seen. The second Bragg grating RB2-A, which is etched into the side 21 of the strip waveguide 15, may be seen in FIG. 4. The rib 17 is wide (enlarged) in the section in which the second Bragg grating RB2-A is located and possesses one narrow section 24. However, more narrow sections 24 may of course be envisioned.

The width of the rib 17 at the level of the narrow sections 24 and at the level of the central portion 26 is comprised between 0.2 µm and 0.8 µm.

The maximum width $I_{max}$ of the rib 17 is larger than $L_A$ and smaller than 3 µm.

Reference is now made to FIGS. 1 and 4. As may be seen in these figures, the laser device 1 furthermore includes an output grating 27.

This grating 27, for coupling to an optical fiber 29, may include a grating of trenches partially produced in the waveguide 11, for example by etching the latter. Preferably, the trenches are substantially perpendicular to the longitudinal axis of the waveguide 11, and are formed on a bottom side of the waveguide 11, the bottom side 31 being, in FIG. 1, that side of the waveguide 11 which is oriented downward and substantially parallel to the plane of the waveguide 11. For a waveguide 11 with the aforementioned dimensions, the trenches may have a depth of 125 nm or even more if necessary. The grating may, for example, be defined using a hard mask and then a directional etch.

Moreover, eutectic deposits 33 and 35 (FIG. 2), deposited on the first doped layer 7 and the second doped layer 9, respectively, allow metal contacts to be connected to the layers 7 and 9.

Because the first RB1-A, RB1-B and second RB2-A, RB2-B gratings of the sets RBE-A and RBE-B of Bragg gratings are located on opposite sides, flexibility is obtained in the design of the laser device 1 and losses are minimized, thereby making it possible to produce shorter sets of Bragg gratings and less bulky laser devices 1.

The laser devices 1 thus obtained operate in an analogous way to known SG-DBR lasers.

Figure 5:
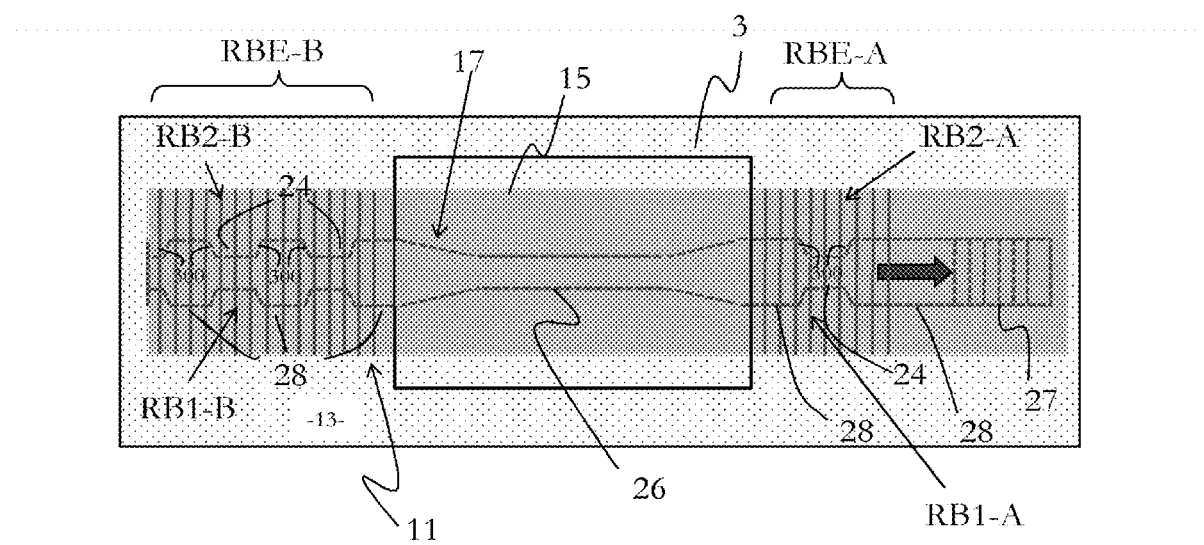
FIG. 5 shows a partial top view of a second embodiment of the laser device according to the invention.

FIG. 5 shows in an identical view to that in FIG. 4 a second embodiment of the laser device 1 according to the invention.

This embodiment differs from that in FIGS. 1 to 4 in that the transitional flanks 300 are inclined with respect to a direction perpendicular to the propagation direction of the light, thereby allowing less abrupt coupling to be ensured. In this case, losses become negligible.

Figure 6:
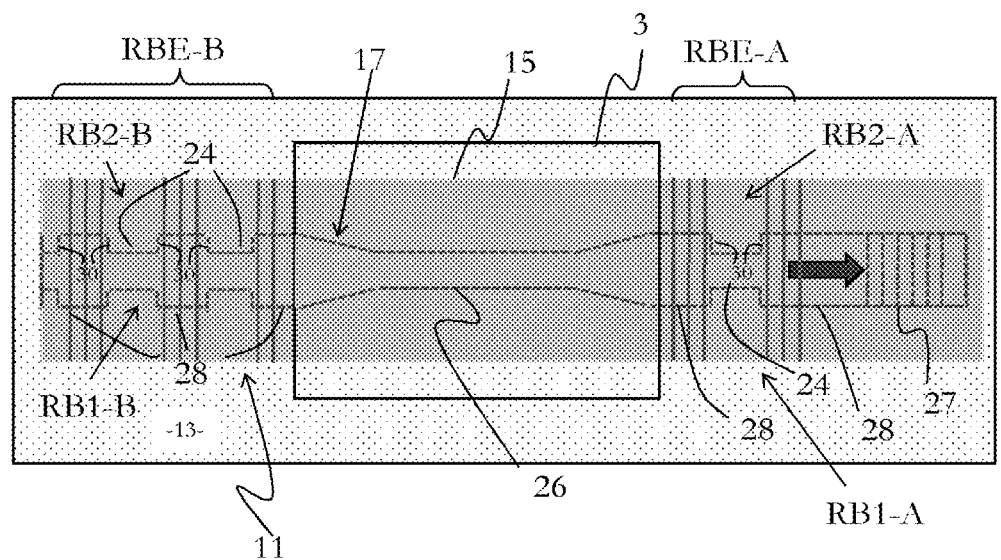
FIG. 6 shows a partial top view of a third embodiment of the laser device according to the invention.

FIG. 6 shows a third embodiment of the laser device 1 according to the invention, which embodiment is a derivation of what are called sampled Bragg gratings.

According to this embodiment, the second Bragg grating RB2-A or RB2-B is only etched at the level of the first Bragg grating RB1-A or RB1-B in the location of the wider sections 28 of the rib 17. Thus, for the second grating RB2-A or RB2-B "oversampling" (or a Bragg grating with more closely spaced and more numerous phase jumps for a given wavelength range) is obtained, allowing further multiplication of the reflection peaks and greater flexibility in the tunability of the laser device 1 to be achieved. By "oversampling" what is meant here is both/either a higher number of reflection peaks per determined wavelength domain (Vernier effect) and/or a larger overlap of the usable wavelength domains, this being achieved by shifting said reflection peaks by simultaneously changing the index of the two sets RBE-A and RBE-B of Bragg gratings.

Figure 7:
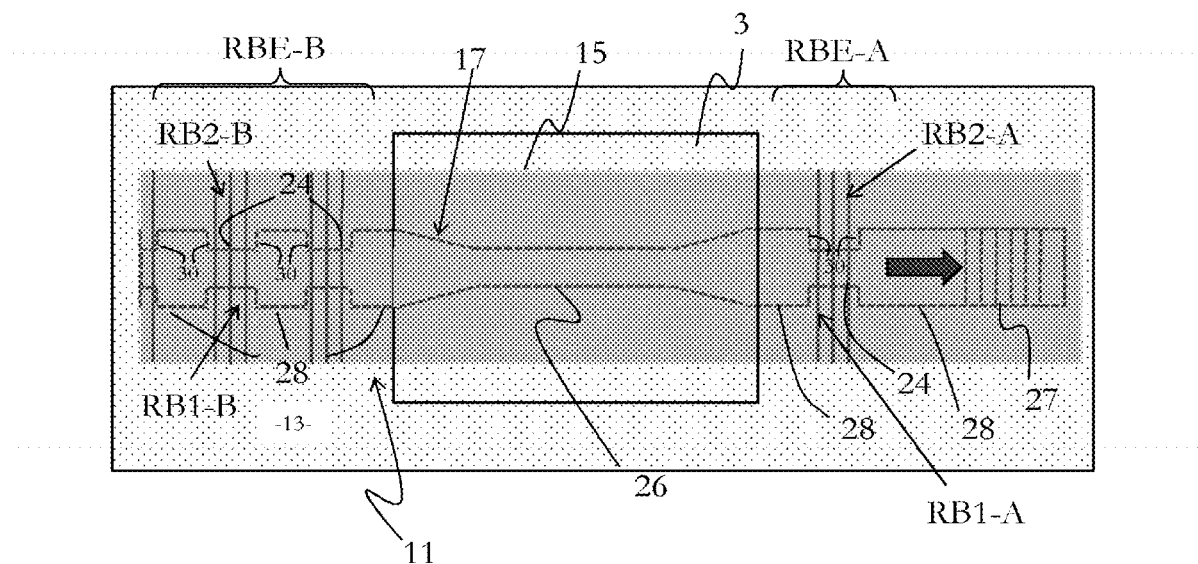
FIG. 7 shows a partial top view of a fourth embodiment of the laser device according to the invention.

FIG. 7 shows a fourth embodiment of the laser device 1 according to the invention.

It is a question of a variant of the embodiment in FIG. 6. In this embodiment, the second Bragg grating RB2-A or RB2-B is only etched at the level of the first Bragg grating RB1-A or RB1-B in the location of the narrow sections 24 of the rib 17. This embodiment operates in a similar way to the embodiment in FIG. 6.

Figure 8A:
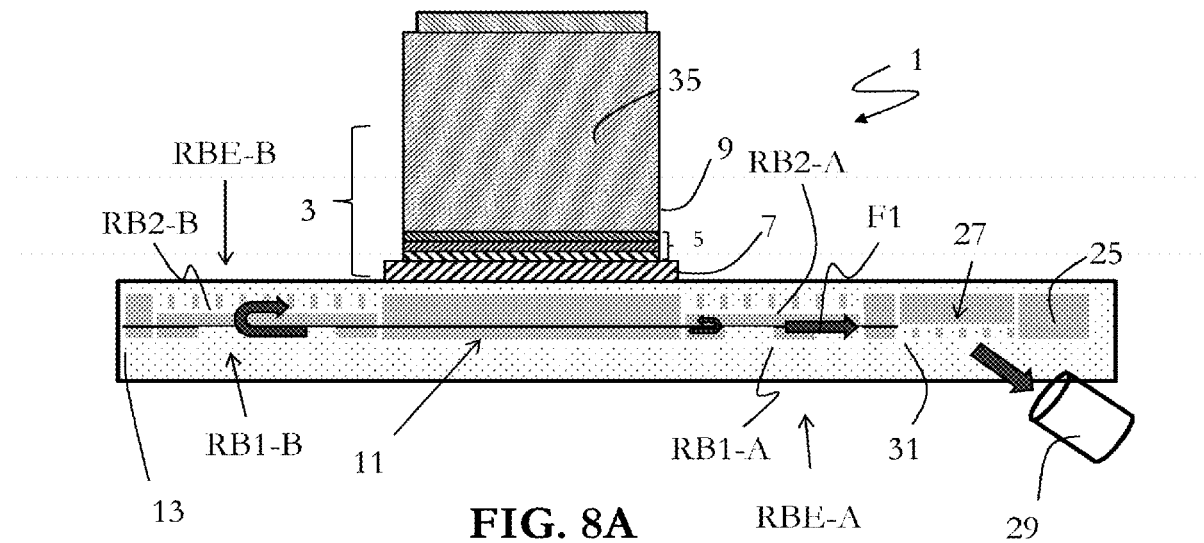
FIG. 8A shows a schematic longitudinal cross-sectional view of a fifth embodiment of a laser device according to the invention.
Figure 8B:
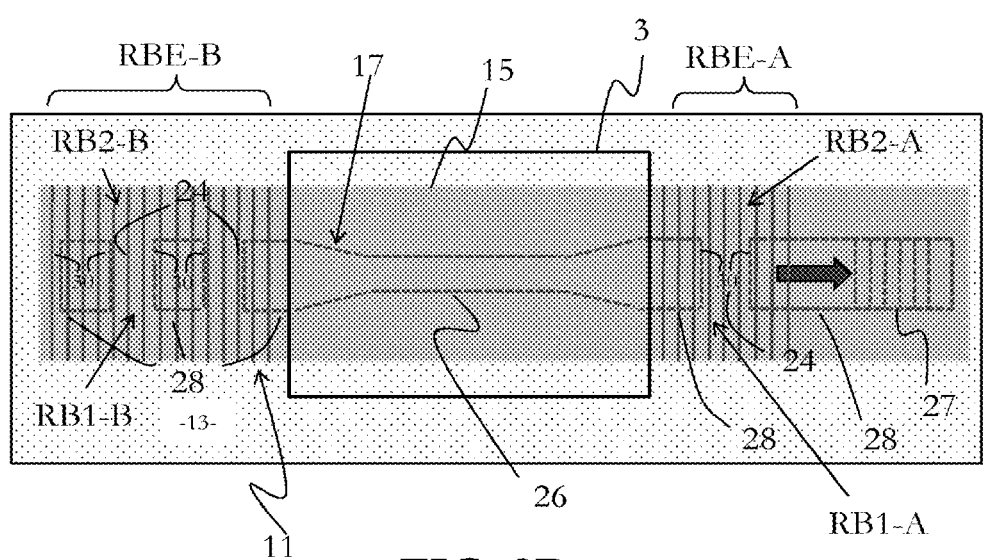
FIG. 8B shows a partial top view of the fifth embodiment of the laser device according to the invention.

FIGS. 8A and 8B show a fifth embodiment of the laser device according to invention.

This embodiment differs from that in FIGS. 1 to 4 in that the width of the rib 17 in the narrow sections 24 is equal to zero. To achieve this, sections of the rib 17 are for example removed by etching.

As a result, the etch depth of the second Bragg gratings RB2-A and RB2-B on one side and of the first Bragg gratings RB1-A and RB1-B on the other side is different. In particular, the etch depth of the first grating RB1-A and RB1-B is larger than the etch depth of the second grating RB2-A and RB2-B, thereby allowing even greater flexibility in the design of such a laser device 1 according to the invention.

Figure 9A:
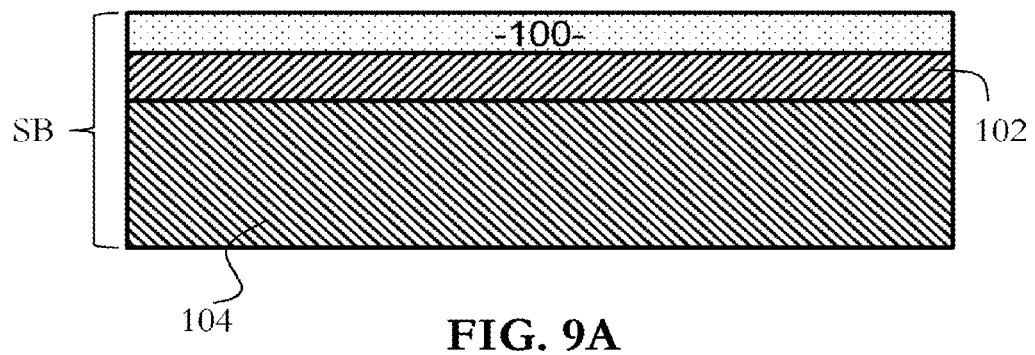
FIGS. 9A, 10A/10B to 18A/18B show schematic cross-sectional views illustrating a process for fabricating a laser device according to the invention, the figures "A" being schematic longitudinal cross-sectional views whereas the figures "B" are the corresponding transverse cross-sectional views.
Figure 10A:
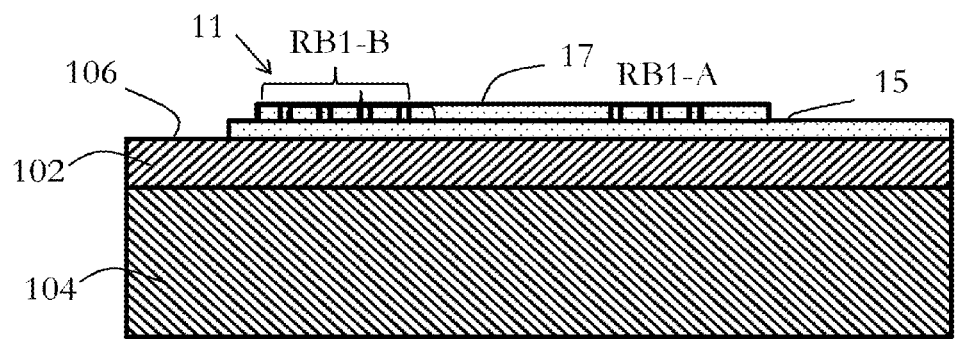

With reference to FIGS. 9A, 10A/10B to 19A/19B, a process for fabricating a laser device 1 according to the invention will now be described.

FIGS. 9A, 10A/10B to 18A/18B show schematic cross-sectional views, the figures "A" being schematic longitudinal cross-sectional views whereas the figures "B" are corresponding transverse cross-sectional views.

As may be seen in FIG. 9A, the reference SB designates a silicon-on-insulator (SOI) substrate wafer.

This SOI substrate includes a silicon layer or film 100 for example having a thickness comprised between 200 nm and 1 µm and typically 500 nm, said layer being placed above a buried insulating layer 102 that is commonly designated a BOX (for Buried OXide). This buried insulating layer 102 is itself placed above a carrier substrate 104.

Figure 10B:
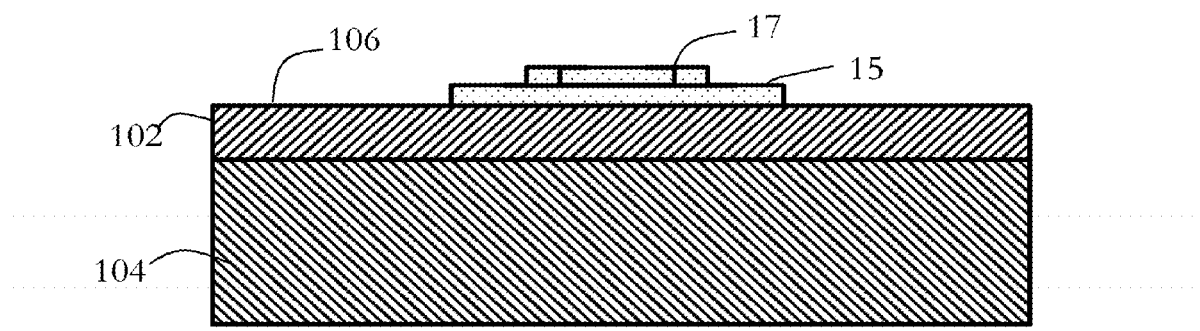

In a first step shown in FIGS. 10A and 10B, the silicon layer 100 is structured, for example by etching, to obtain a rib waveguide 11. If the laser device 1 forms part of a larger functional assembly, other components (modulators, photodetectors, etc.) may be produced in this step on the top side 106 of the BOX layer 102.

In this step, first Bragg gratings RB1-A, RB1-B of the sets of Bragg gratings RBE-A, RBE-B are also produced in the rib 11 or during the structuring of the silicon layer 100.

Figure 11A:
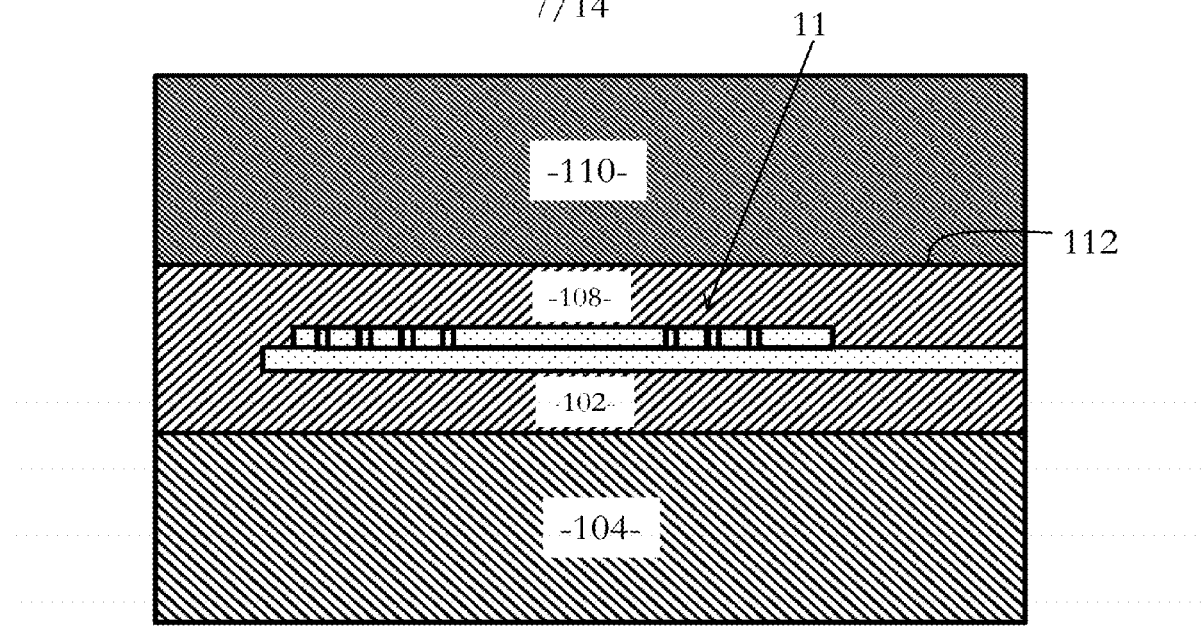
Figure 11B:
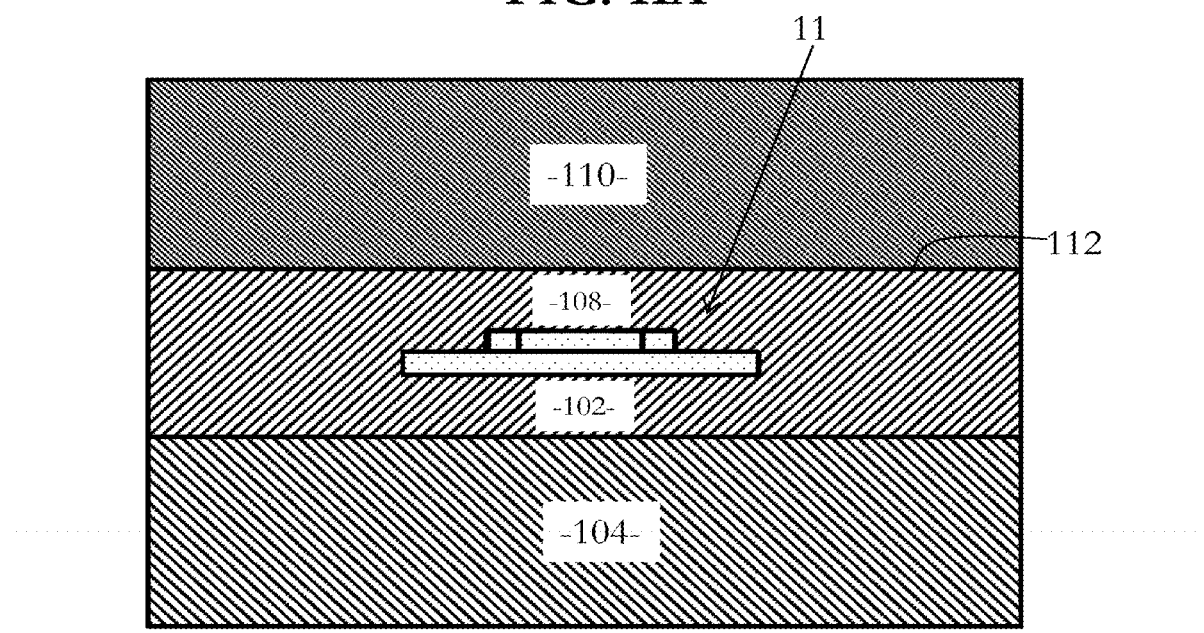

As may be seen in FIGS. 11A and 11B, an insulating layer 108, for example of $SiO_2$, is deposited to encapsulate the rib waveguide 11. Then a carrier substrate 110 is bonded to the top side 112 of the insulating layer 108.

Figure 12A:
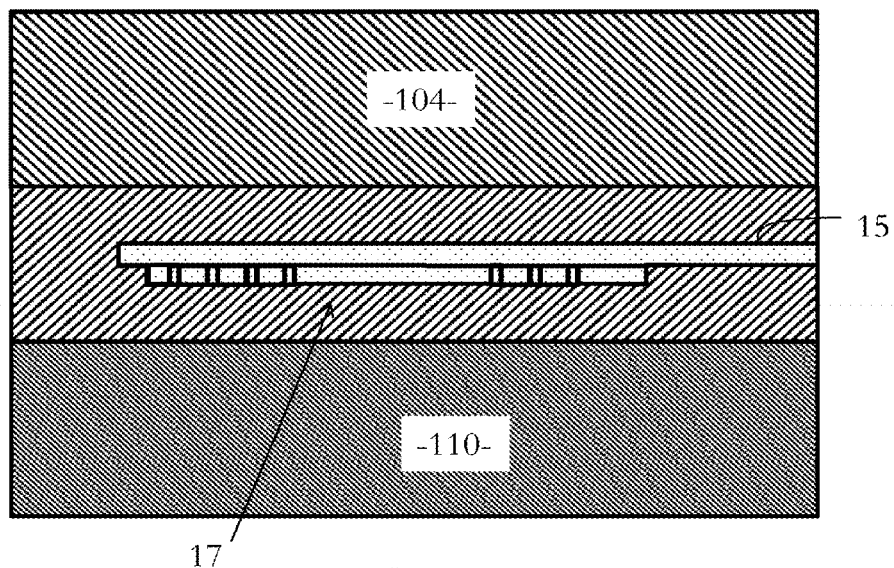
Figure 12B:
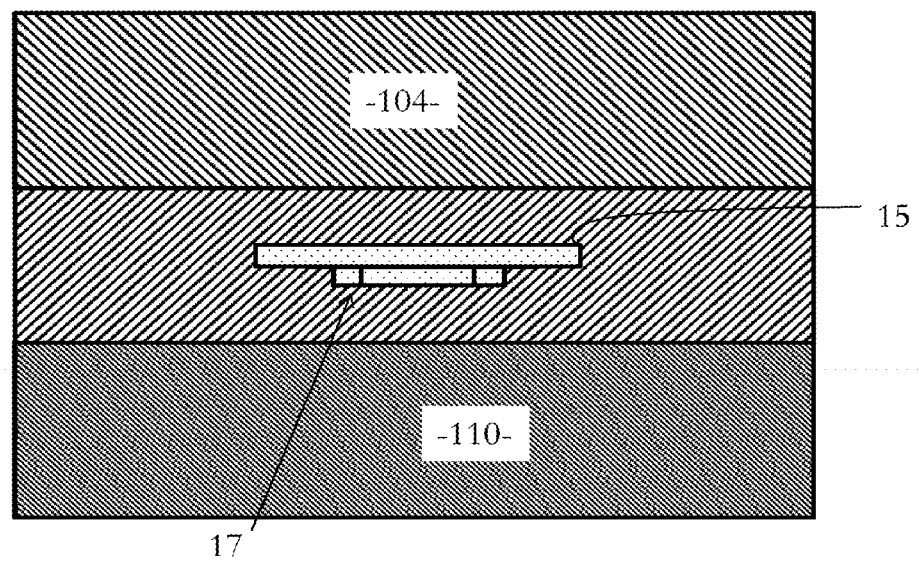

In the next step (FIGS. 12A and 12B), the assembly is flipped so that the rib 17 is directed downward in the figure and the strip guide 15 is located on top.

Figure 13A:
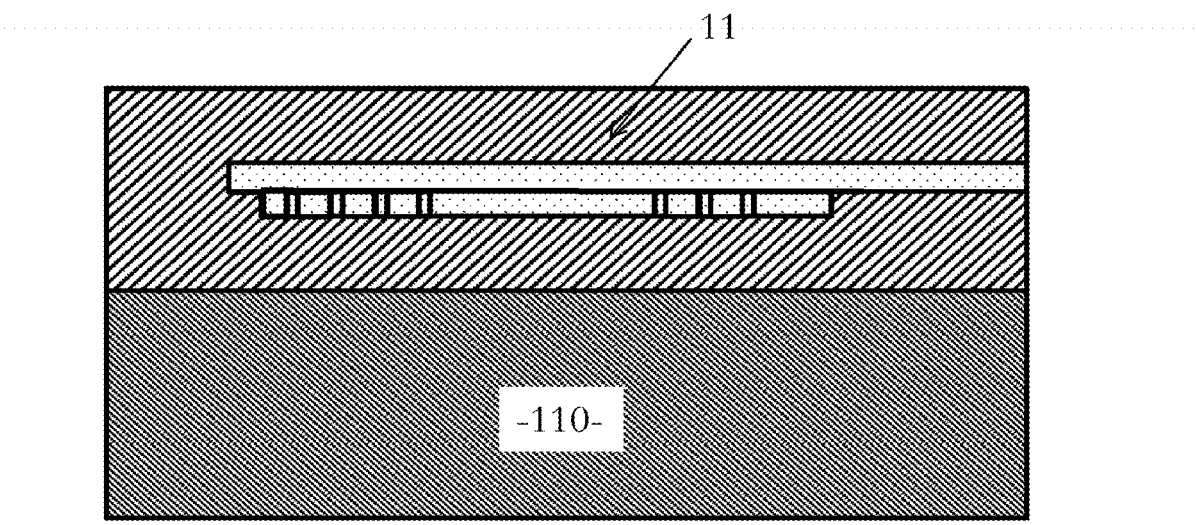
Figure 13B:
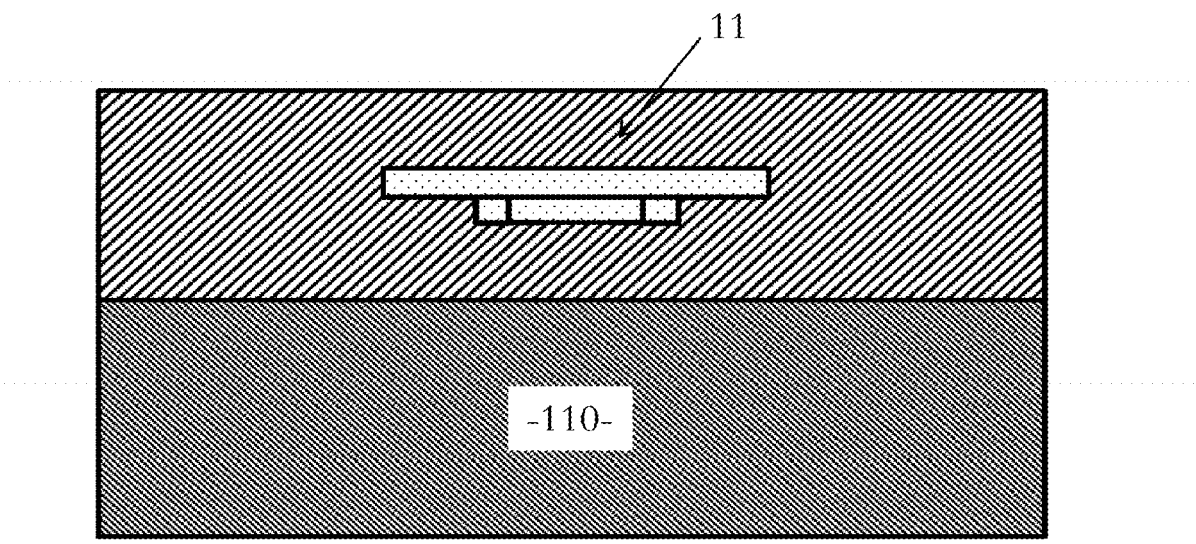

Next, the carrier substrate layer 104 is removed, for example by grinding or by chemical-mechanical polishing. The BOX layer 102 (which may serve as a stop layer for the polishing) is then on top and completely uncovered (see FIGS. 13A and 13B).

Figure 14A:
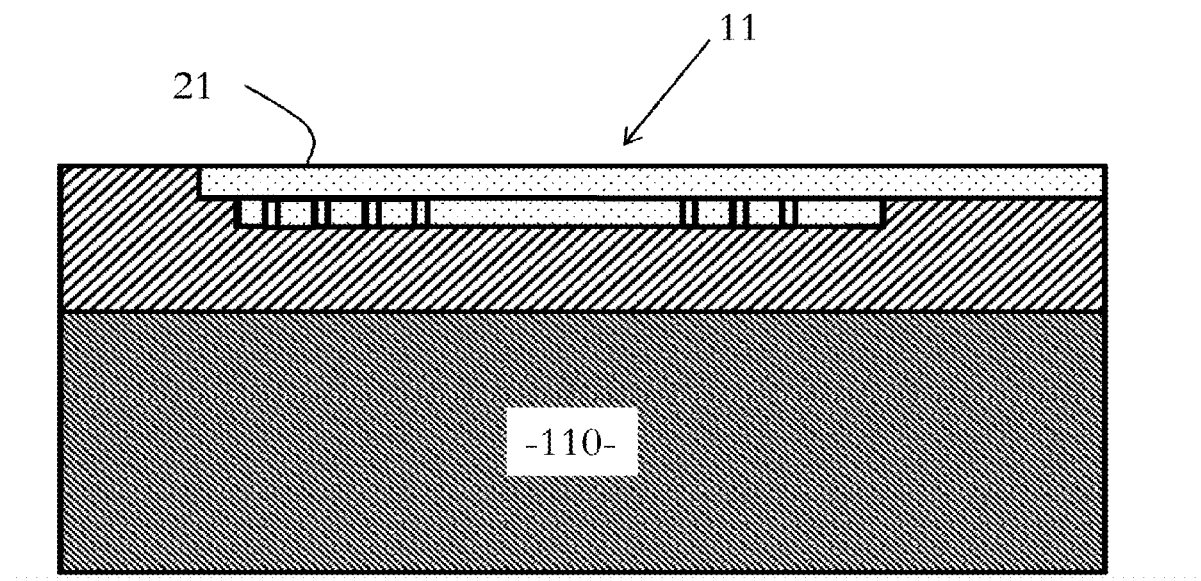
Figure 14B:
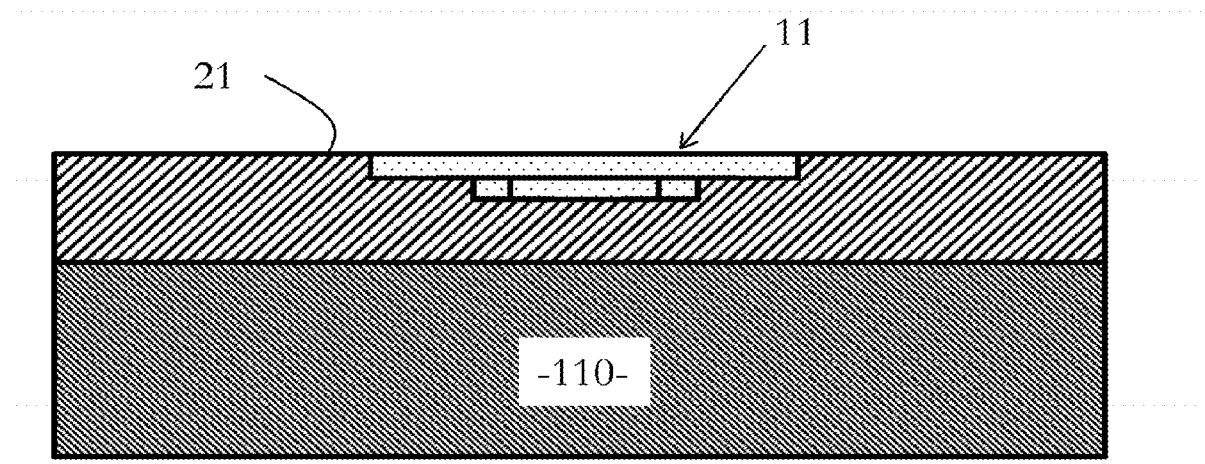

Next, the BOX layer 102 is removed by selective wet chemistry or by dry etching, for example reactive ion etching (RIE) or inductively coupled plasma (ICP) etching, so as to uncover that side 21 of the strip waveguide 15 which will be turned, as will be seen, toward the gain medium 3 (see FIGS. 14A and 14B).

Figure 15A:
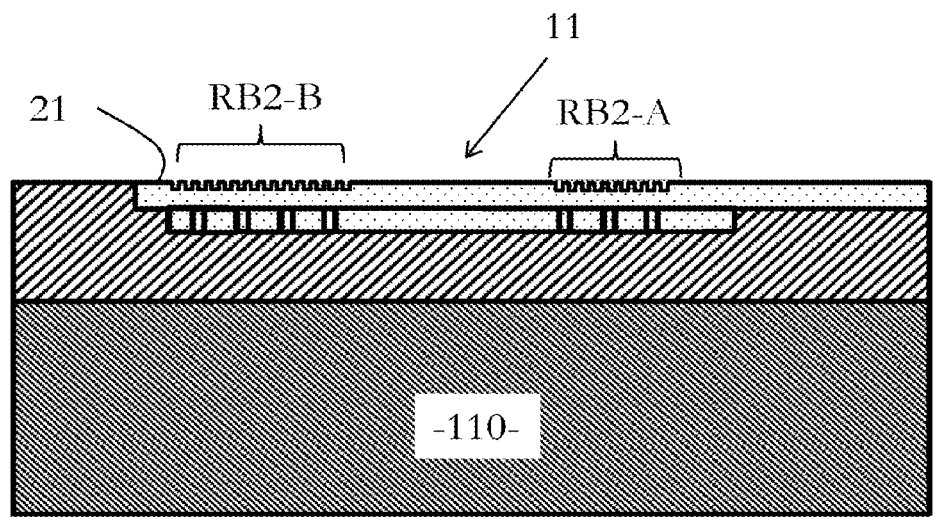
Figure 15B:
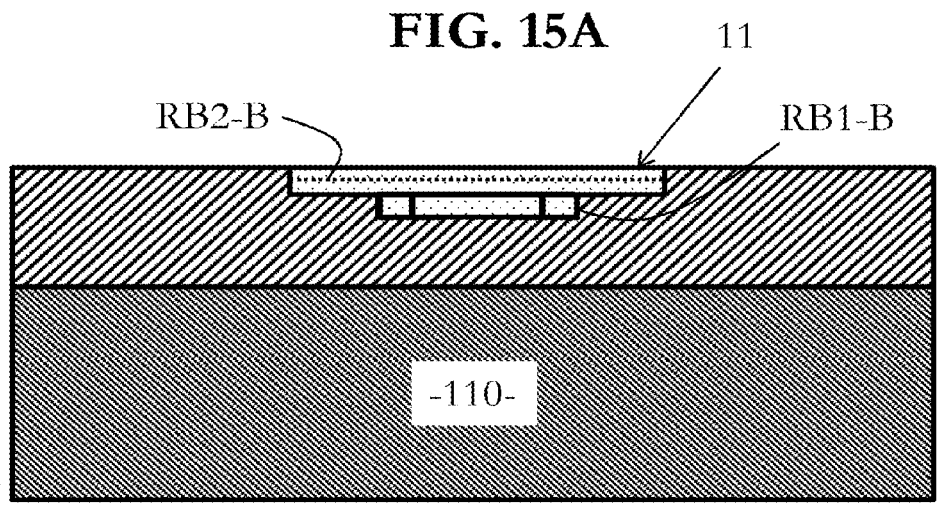

In the next step (see FIGS. 15A and 15B), the second Bragg gratings RB2-A and RB2-B are etched (or structured) in the side 21 of the silicon layer 100 thus exposed, preferably over the entire width of the strip guide 15.

According to one variant (not shown), an additional amorphous-silicon layer is deposited on some of the strip waveguide and the second Bragg gratings are etched (or structured) in this additional amorphous-silicon layer. In this case, the longitudinal rib 17 is therefore made of crystalline silicon and the strip waveguide 15 is formed by two layers, the layer making contact with the longitudinal rib 17 also being made of crystalline silicon and the other layer proximal to the gain medium 3 being made of amorphous silicon. The longitudinal rib 17 and the crystalline-silicon layer of the strip waveguide 15 are located in the silicon-on-insulator (SOI) layer 13.

This makes it possible to retain a maximal compatibility with existing photonic processes and photonic devices made of silicon (for example modulators or photodetectors) and to minimize the thermal budget applied to the amorphous-silicon layer.

Figure 16A:
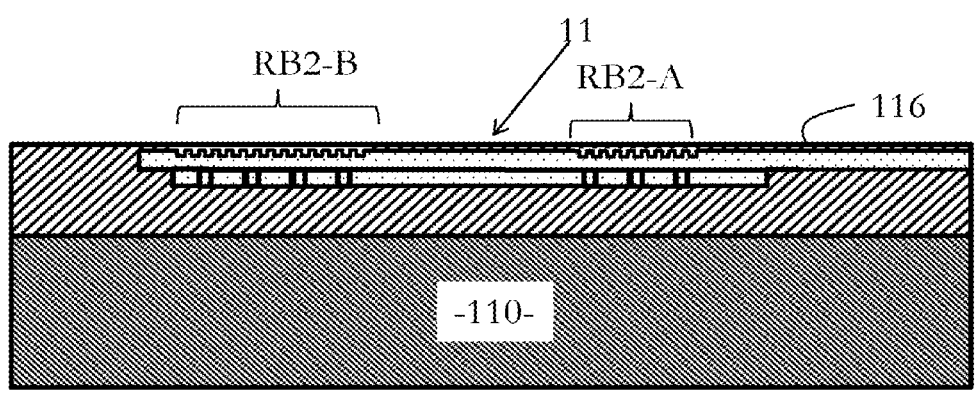
Figure 16B:
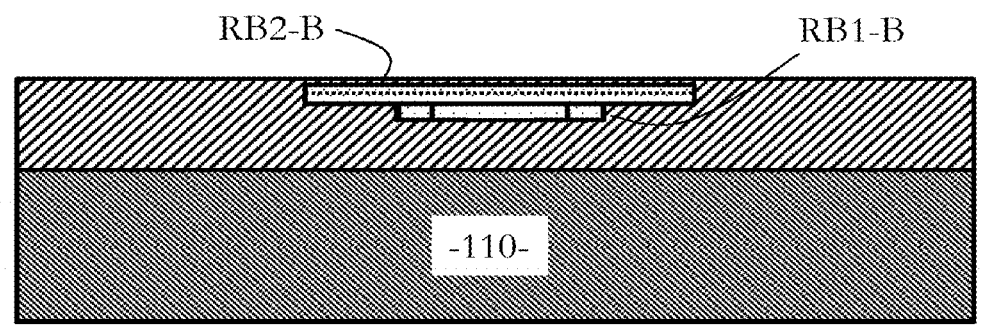

Next, both in the case of the first and second variant, an additional insulating layer 116, for example made of $SiO_2$, of about one hundred nm thickness is deposited on all the side thus uncovered (see FIGS. 16A and 16B). This additional layer 116 may then be subjected to a chemical-mechanical polish.

Figure 17A:
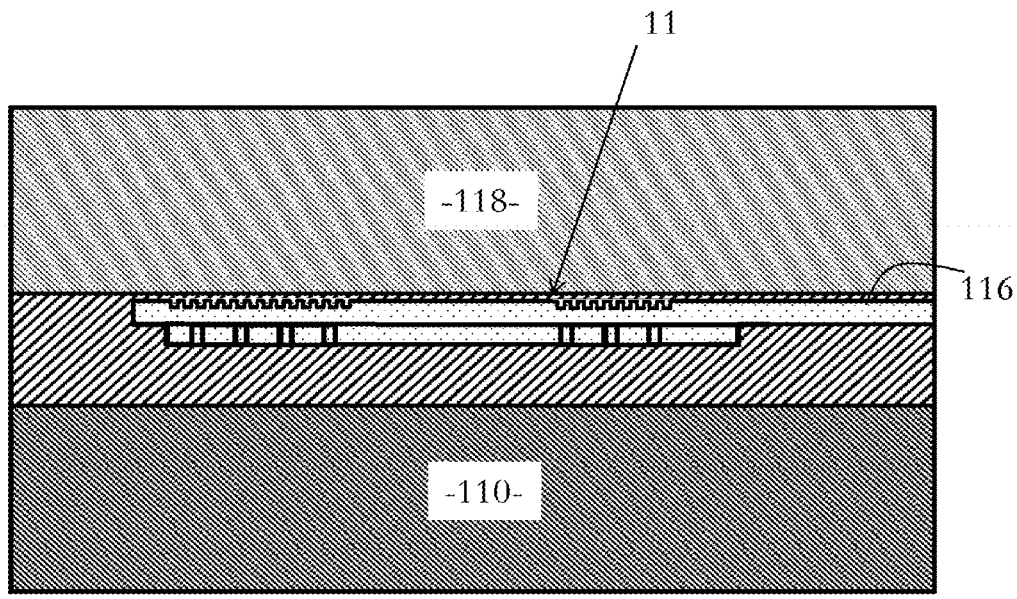
Figure 17B:
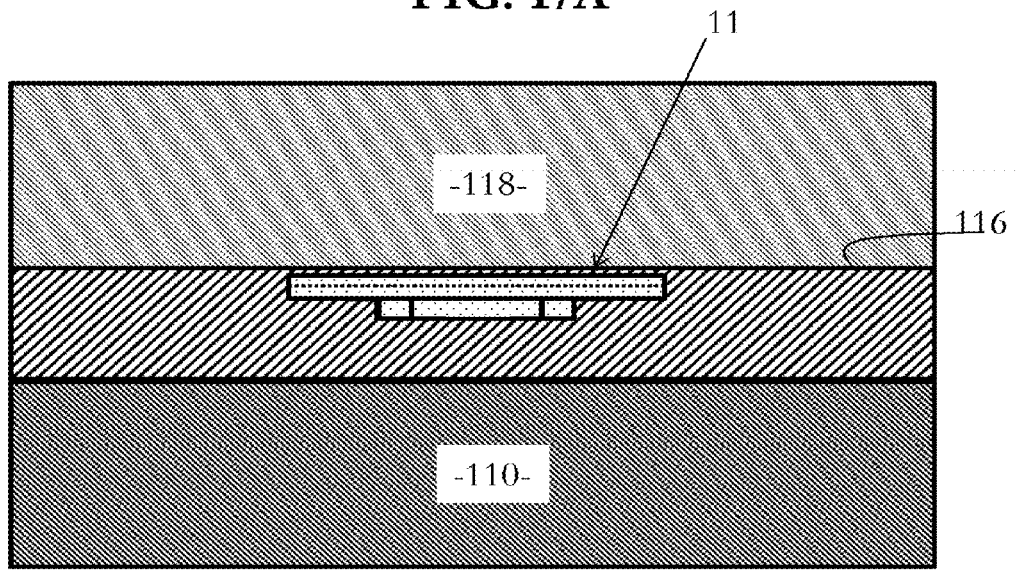

Next, a III-V wafer 118 including a III-V heterostructure on one side is provided. Next, the wafer 118 is bonded, for example by direct bonding, to the additional layer 116 (see FIGS. 17A and 17B), so that the heterostructure makes contact with the structure produced beforehand in the silicon.

Figure 18A:
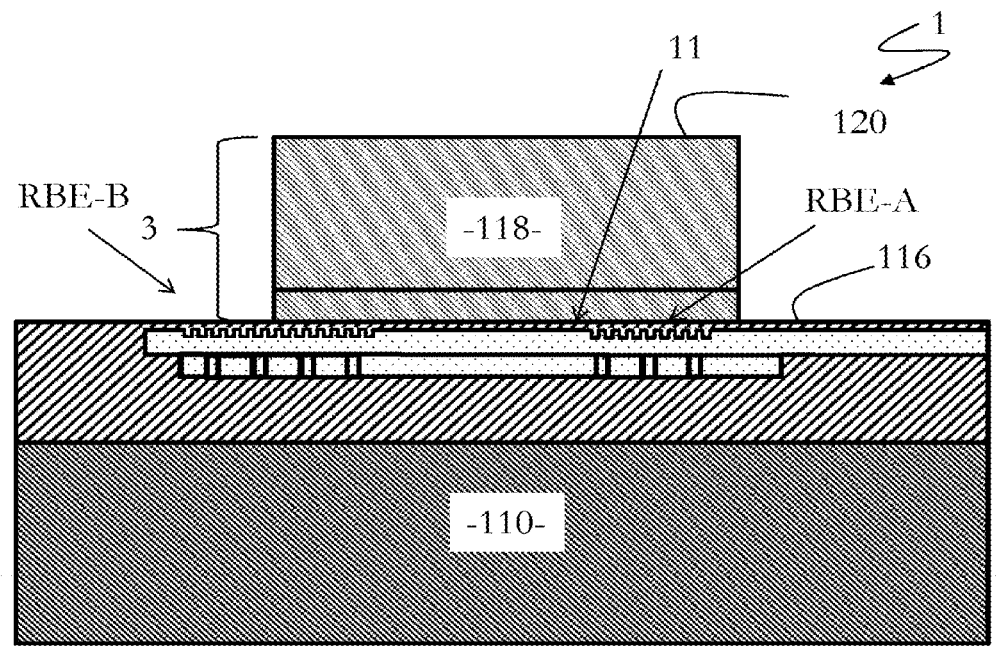
Figure 18B:
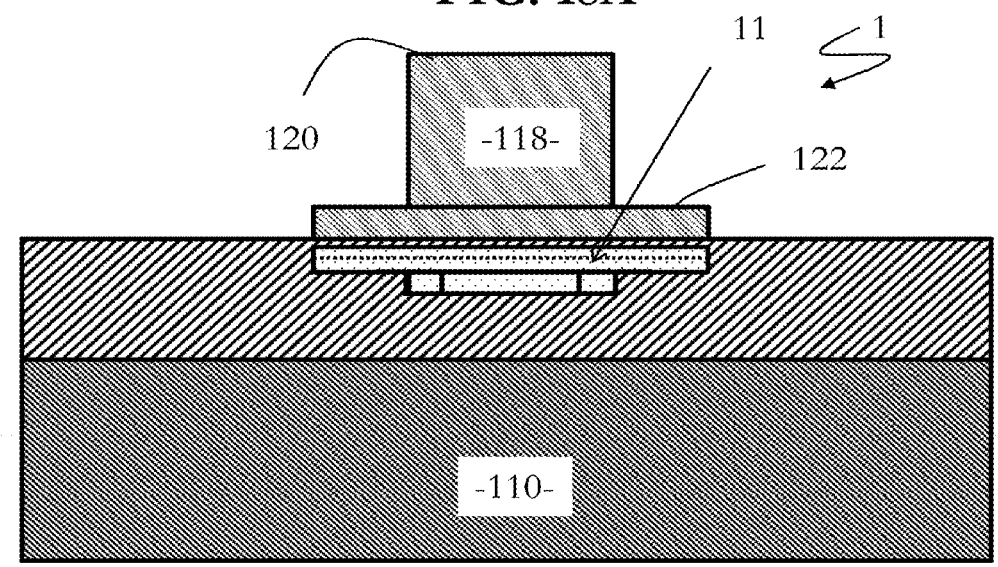

Lastly, the substrate of the bonded wafer 118 is selectively chemically etched so as to obtain the gain medium 3 (see FIGS. 18A and 18B). For the sake of simplicity, layers 9, 5 and 7 of the gain medium have not been shown.

It is then possible to produce eutectic deposits, which are for example gold-based, so as to allow metal contacts to be connected to the etched layers 120 and 122.

Next, the assembly may be encapsulated by depositing another insulating layer and metal contacts may be produced in the conventional way.

It will therefore be understood that the laser device 1 according to the invention may be fabricated without difficulty and allows a great deal of flexibility in its design and thus the increasingly demanding requirements of the market, in particular the telecommunications market, to be met.

The invention claimed is:

1. A III-V heterostructure laser device located in and/or on silicon, comprising
  a III-V heterostructure gain medium, and
  a rib optical waveguide, located facing the gain medium and comprising a strip waveguide equipped with a longitudinal rib, the rib optical waveguide being located in the silicon,
  two sets of Bragg gratings formed in the rib optical waveguide and located on either side of the III-V heterostructure gain medium,
  each set of Bragg gratings comprising a first Bragg grating having a first pitch and formed in the rib and a second Bragg grating having a second pitch different from the first pitch and formed on that side of the rib waveguide which is opposite the rib.

2. The laser device as claimed in claim 1, wherein the rib optical waveguide is oriented so that the rib is located on that side of the strip waveguide that is distal with respect to the gain medium.

3. The laser device as claimed in claim 2, wherein the first pitch of the first Bragg gratings formed in the rib is larger than the second pitch of the second grating formed on that side of the rib waveguide which is opposite the rib.

4. The laser device as claimed in claim 1, wherein one of the sets of Bragg gratings possesses a length comprised between 700 µm and 1000 µm, limits inclusive, and a reflectivity higher than 90%, and in that the other of the sets of Bragg gratings possesses a length comprised between 300 µm and 600 µm, limits inclusive, and a reflectivity comprised between 30% and 80%, limits inclusive.

5. The laser device as claimed in claim 1, wherein the first Bragg gratings are formed by narrow sections and wider sections of the rib.

6. The laser device as claimed in claim 5, wherein the width of the rib in the narrow sections is comprised between 0%-80% of the width of the wider sections of the rib.

7. The laser device as claimed in claim 5, wherein the second Bragg gratings are only formed at the level of the first Bragg gratings in the location of the wider sections of the rib.

8. The laser device as claimed in claim 5, wherein the second Bragg gratings are only formed at the level of the first Bragg gratings in the location of the narrow sections of the rib.

9. The laser device as claimed claim 5, wherein the transition between the narrow sections and the wide sections defines transitional flanks that are oriented perpendicularly to the propagation direction of the light.

10. The laser device as claimed in claim 5, wherein the transition between the narrow sections and the wide sections defines transitional flanks that are inclined with respect to a direction that is perpendicular to the propagation direction of the light.

11. The laser device as claimed in claim 5, wherein the etching depth of the two gratings of a set of Bragg gratings is different.

12. The laser device as claimed in claim 3, wherein the etching depth of the first gratings is larger than the etching depth of the second gratings.

13. The laser device as claimed in claim 1, wherein the width of the second gratings of the sets of Bragg gratings is larger than that of the rib.

14. The laser device as claimed in claim 1, wherein the width of the second gratings of the sets of Bragg gratings is substantially equal to the width of the strip waveguide.

15. The laser device as claimed in claim 1, wherein the strip waveguide and the longitudinal rib are each formed from crystalline silicon or one is made of crystalline silicon and the other of amorphous silicon.

16. The laser device as claimed in claim 1, wherein the longitudinal rib is made of crystalline silicon and the strip waveguide is formed by two layers, the layer making contact with the longitudinal rib also being made of crystalline silicon and the other layer proximal to the gain medium being made of amorphous silicon.

17. A process for fabricating a laser device as claimed in claim 1, comprising the following steps:
   producing a rib waveguide comprising a strip waveguide equipped with a longitudinal rib in a silicon layer that is located above a buried insulating layer, which itself is located above a carrier substrate;
   producing by etching in the rib first gratings of the sets of Bragg gratings;
   encapsulating in a first insulating layer the rib waveguide;
   flipping the assembly;
   removing the carrier substrate and the first buried insulating layer so as to uncover a side of the strip waveguide;
   producing by etching the second gratings of the sets of Bragg gratings in the side of the strip waveguide;
   depositing a second insulating layer and carrying out chemical-mechanical polishing of the second insulating layer;
   depositing a heterostructure formed from III-V semiconductor; and
   carrying out selective chemical etching of the heterostructure to obtain a gain medium.

* * * * *